United States Patent [19]
Yang et al.

[11] Patent Number: 6,004,853
[45] Date of Patent: Dec. 21, 1999

[54] METHOD TO IMPROVE UNIFORMITY AND THE CRITICAL DIMENSIONS OF A DRAM GATE STRUCTURE

[75] Inventors: Hsiao-Ying Yang, Hsin-Chu; Yeh-Sen Lin, Tao-Yuan, both of Taiwan

[73] Assignee: Vanguard International Semiconductor Corporation, Hsin-Chu, Taiwan

[21] Appl. No.: 09/320,753

[22] Filed: May 27, 1999

[51] Int. Cl.$^6$ .................................................. H01L 21/336
[52] U.S. Cl. ..................... 438/305; 438/585; 438/592; 438/952
[58] Field of Search ..................... 438/197, 305, 438/592, 585, FOR 193, 742, 952

[56] References Cited

U.S. PATENT DOCUMENTS

| | | |
|---|---|---|
| 5,600,165 | 2/1997 | Tsukamoto et al. . |
| 5,907,781 | 5/1999 | Chen et al. . |
| 5,937,319 | 8/1999 | Xiang et al. . |

*Primary Examiner*—George Fourson
*Attorney, Agent, or Firm*—George O. Saile; Stephen B. Ackerman

[57] ABSTRACT

A process for fabricating a straight walled, silicon nitride capped, gate structure, for a MOSFET device, has been developed. The process features the creation of a straight walled, photoresist shape, to be used as an etch mask, during the patterning of the straight walled, silicon nitride capped, gate structure. A silicon oxynitride layer, with a specific thickness range between about 820 to 920 Angstroms, is used as a bottom anti-reflective coating, (BARC), layer, located between an overlying straight walled, photoresist shape, and an underlying silicon nitride capping layer. The BARC layer retards the reflection emitted from a silicon nitride capping layer, during the photolithographic exposure procedure, used for definition of the straight walled, photoresist shape, allowing the desired straight walled, photoresist shape, to be obtained, independent of the thickness of the silicon nitride capping layer. The ability to fabricate straight walled, silicon nitride capped, gate structures, allows control, and uniformity, of channel regions, located underlying the straight walled, silicon nitride capped, gate structure, and between source/drain regions, self-aligned to the straight walled, silicon nitride capped, gate structures, to be realized.

23 Claims, 6 Drawing Sheets

METHOD TO IMPROVE UNIFORMITY AND THE CRITICAL DIMENSIONS OF A DRAM GATE STRUCTURE

BACKGROUND OF THE INVENTION

(1) Field of the Invention

The present invention relates to methods used to fabricate semiconductor devices, and more specifically to a method used to create a gate structure, for a dynamic random access memory, (DRAM), device

(2) Description of Prior Art

The semiconductor industry is continually striving to improve device performance. The use of sub-micron features, for semiconductor devices, has allowed performance degrading, junction capacitances, to be decreased, resulting in a portion of the performance objectives to be realized. In addition the use of narrow channel lengths have also contributed to the objective of enhanced performance. The ability to form metal oxide semiconductor field effect transistor, (MOSFET), devices, with narrow channel lengths, is directly related to the width of an overlying gate structure. The channel length of the MOSFET device is defined by the self-alignment of a source/drain region, formed using the overlying gate structure as a mask. The gate structure, either a polysilicon, or a polycide, (metal silicide—polysilicon), gate structure, is created via an anisotropic reactive ion etching, (RIE), procedure, applied to a polysilicon, or polycide layer, using an overlying photoresist shape as an etch mask. For many applications, such as for DRAM devices, silicon nitride capped gate structures, are used, allowing subsequent procedures, such as the formation of self-aligned contact openings, to be made. The use of silicon nitride capped, gate structures, now demand that the anisotropic RIE procedure, define the desired gate structure pattern in a silicon nitride layer, as well as in the underlying polysilicon, or polycide layer. However the silicon nitride layer presents reflectivity problems during the photolithographic exposure procedure, used to create the photoresist shape, that is needed as the etch mask for definition of the sub-micron width, gate structure. The reflectivity from the silicon nitride layer results in unwanted exposure of portions of the photoresist layer, creating a photoresist shape, exhibiting a thinned, or necked, profile. When the photoresist shape, featuring a necked profile, is used as an etch mask, the resulting gate structure can have a defective, or unwanted profile, thus adversely influencing the underlying channel length, and subsequent device performance.

A method used to minimize the reflectance, encountered during the photolithographic exposure procedure, used to create the gate structure, photoresist shape, is the use of a bottom anti-reflective coating, (BARC), layer, placed between the overlying photoresist layer, and the underlying silicon nitride capping layer. A BARC layer, such as a silicon oxynitride, (SiON), layer however, if applied at a specific thickness range, does not provide the needed reflectance protection, for wide ranges of silicon nitride thicknesses. For example a SiON, BARC layer, at a thickness between about 100 to 300 Angstroms, will only supply the desired reflectance protection for very specific ranges of silicon nitride thicknesses. Therefore slight thickness variations in the silicon nitride capping layer, that can be encountered within a wafer, or from wafer to wafer, can result in unwanted profiles of the photoresist shape, used as a mask for gate structure definition, thus resulting in uncertain channel lengths.

This invention will describe a process that allows the reflectivity, presented by all thickness of silicon nitride, as a result of the photolithographic exposure procedure, to be minimized, or eliminated. This is accomplished via the use of a SiON BARC layer, with a thickness between about 820 to 920 Angstroms, providing the unexpected result of between one to two orders of magnitude, decrease in reflectivity, for a range of thicknesses of silicon nitride capping layers, between 200 to 3000 Angstroms. Prior art, such as Tsukamoto et al, in U.S. Pat. No. 5,600,165, describe a anti-reflective coating, however that prior art does not use the anti-reflective coating, as a bottom coating, for the definition of a MOSFET gate structure.

SUMMARY OF THE INVENTION

It is an object of this invention to create a silicon nitride capped, polycide, or polysilicon gate structure, for a DRAM device.

It is another object of this invention to create a narrow width, silicon nitride capped, polycide gate structure, with a straight walled profile, via an anisotropic RIE procedure, using a photoresist shape, with a straight walled profile, as an etch mask.

It is still another object of this invention to create the straight walled photoresist shape, via use of a BARC layer, of a specific thickness, located underlying the photoresist layer, and used to reduce the reflectivity occurring during the exposure procedure, from the silicon nitride capping layer.

In accordance with the present invention a method of creating, a narrow width, straight walled, silicon nitride capped, gate structure, for a MOSFET, or DRAM device, is described. After deposition of a polycide layer, on an underlying gate insulator layer, a silicon nitride capping layer is deposited. A bottom anti-reflective coating, (BARC), layer, comprised of SiON, is next formed on the underlying silicon nitride capping layer, at a thickness between about 820 to 920 Angstroms. A photoresist layer is applied, followed by exposure and development procedures, resulting in a narrow width, straight walled, photoresist shape, overlying the BARC layer. An anisotropic RIE procedure is used to transfer the narrow width, straight walled profile, of the photoresist shape, to the underlying layers. After removal of the SiON BARC layer, the narrow width, straight walled, silicon nitride capped, polycide shape is used as the gate structure, for the MOSFET or DRAM device. A lightly doped source/drain region is formed, self-aligned to the gate structure, followed by the formation of insulator spacers, on the sides of the gate structure, and the creation of a heavily doped source/drain region, self-aligned to the insulator spacers, on the gate structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method used to create a narrow width, straight walled, silicon nitride capped, gate structure, for a DRAM device, via anisotropic RIE procedures, using a straight walled, photoresist shape as an etch mask, and featuring the use of a BARC layer, used to reduce the reflectivity from a silicon nitride capping layer, during the photolithographic exposure procedure, used to form the straight walled photoresist shape, will now be described in detail. This invention will be described using a polycide gate structure, and an N type, or N channel MOSFET device, however this invention can be applied to polysilicon gate structures, as well as to P channel MOSFET devices.

Figure 1:
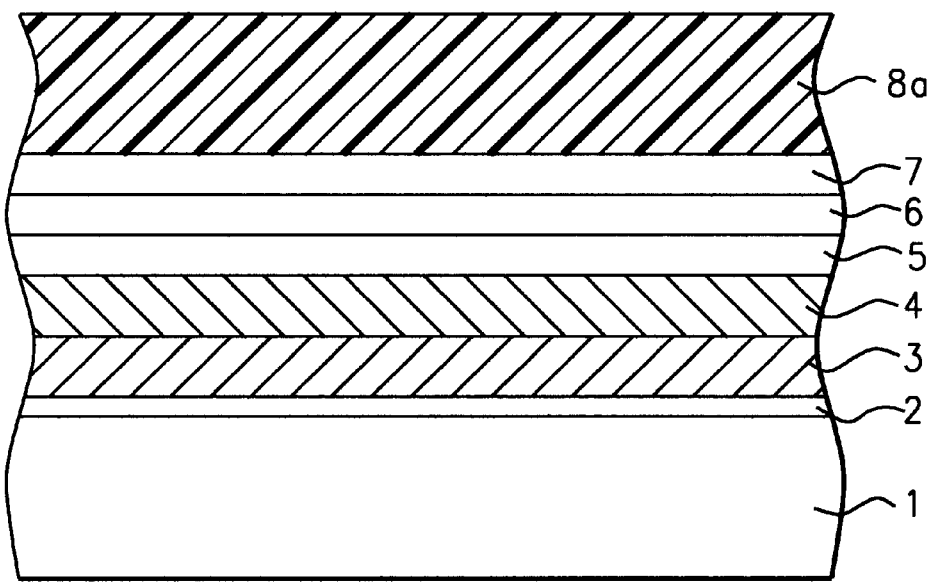
FIGS. 1–3, which schematically, in cross-sectional style, show stages of fabrication used to create a silicon nitride capped, gate structure, using a thin SiON layer, as an anti-reflective coating, underlying a photoresist layer, during the creation of the gate defining, photoresist shape.

A P type, semiconductor substrate 1, comprised of single crystalline silicon, with a <100> crystallographic orientation, is used and schematically shown in FIG. 1. A gate insulator layer 2, comprised of silicon dioxide, at a thickness between about 30 to 150 Angstroms, is thermally grown in an oxygen—steam ambient. Polysilicon layer 3, is next deposited via low pressure chemical vapor deposition procedures, (LPCVD), procedures, at a thickness between about 900 to 1100 Angstroms. Polysilicon layer 3, can be doped in situ, during deposition, via the addition of arsine, or phosphine, to a silane ambient, or polysilicon layer 3, can be deposited intrinsically, then doped via ion implantation of either arsenic, or phosphorous ions. The deposition of metal silicide layer 4, such as tungsten silicide, follows, via LPCVD procedures, at a thickness between about 900 to 1100 Angstroms, using silane and tungsten hexafluoride as reactants. Polycide gate structures, comprised of overlying tungsten silicide layer 4, and underlying polysilicon layer 3, will offer lower word line resistance than counterpart gate structures comprised with only polysilicon. However, if desired, polysilicon alone can be used for the gate structure. A silicon oxide layer 5, obtained via LPCVD or plasma enhanced chemical vapor deposition, (PECVD), procedures, at a thickness between about 200 to 400 Angstroms, is next deposited using tetraethylorthosilicate, (TEOS), as a source. Capping silicon nitride layer 6, shown schematically in FIG. 1, at a thickness between about 1500 to 2500 Angstroms, is then deposited via LPCVD or PECVD procedures.

Prior to definition of a photoresist shape, to be used as an etch mask, for definition of a silicon nitride capped, gate structure, an anti-reflective coating, such as bottom anti-reflective coating, (BARC), layer 7, is formed overlying silicon nitride capping layer 6. BARC layer 7, such as a silicon oxynitride, (SiON), layer, is needed to reduce the reflectivity from silicon nitride capping layer 6, during the photolithographic exposure of an overlying photoresist layer. The photolithographic exposure, and development procedures, create the photoresist shape used as an etch mask for definition of the silicon nitride capped, gate structure. Without the use of the BARC layer, the reflected energy, from the underlying silicon nitride layer, would result in undesired exposure of the photoresist layer, possibly resulting in a non-straight walled, photoresist shape. The straight walled photoresist shape, used as an etch mask for definition of the gate structure, is imperative in obtaining the desired straight walled, gate structure, which in turn is critical in creating a narrow channel length, MOSFET device. Therefore BARC layer 7, at a thickness between about 200 to 300 Angstroms is formed overlying silicon nitride capping layer 6, via PECVD procedures. A photoresist layer 8a, is then applied, overlying BARC layer 7. This is schematically shown un FIG. 1.

Figure 2:
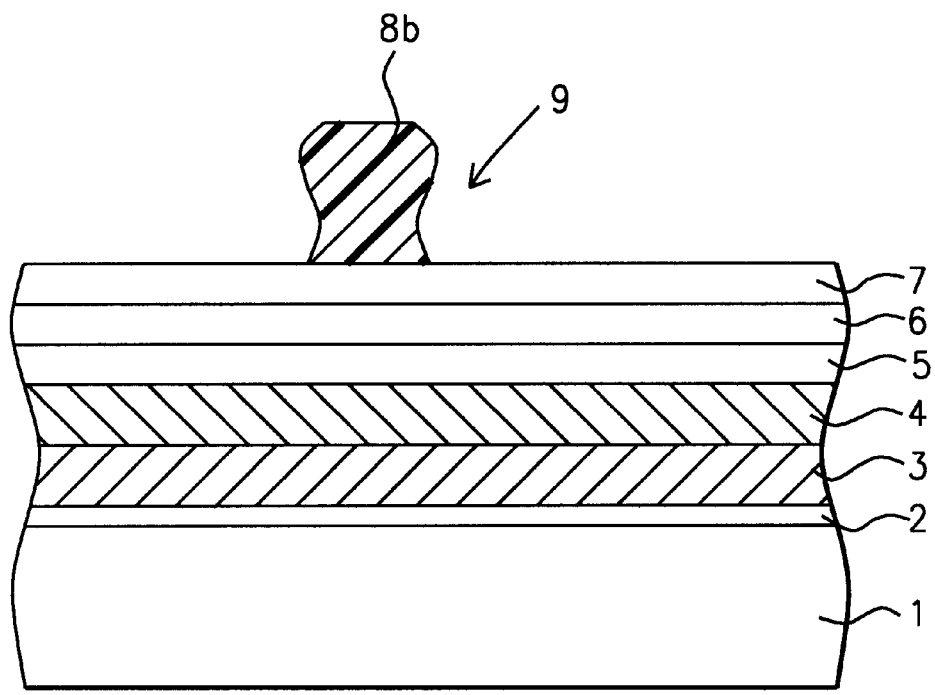
Figure 3:
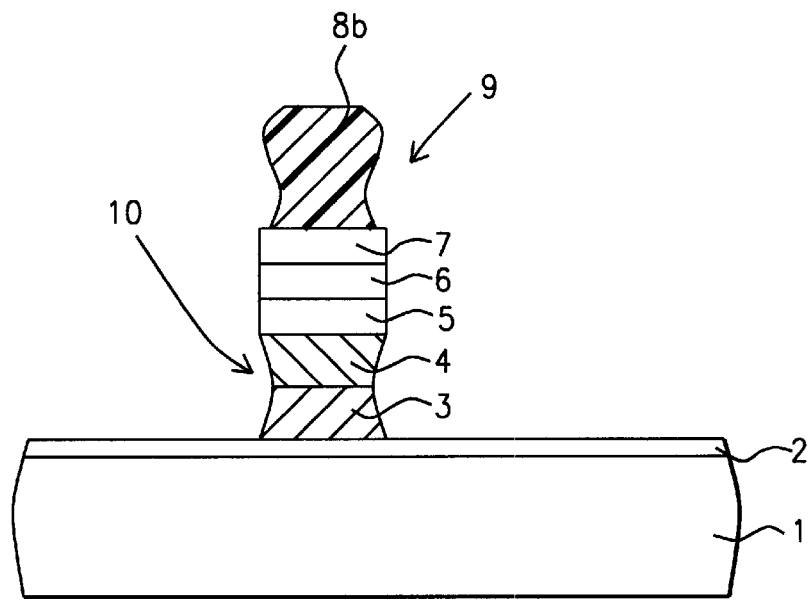

The exposure, and development procedures, needed to create photoresist shape 8b, are next addressed. The exposure procedure, performed at an energy between about 10 to 30 millijoules, results in unwanted exposure of region 9, in photoresist layer 8a, as a result of the reflectivity from silicon nitride layer 6, comprised with a thickness between about 1500 to 2500 Angstroms. BARC layer 7, comprised of a SiON layer, at a thickness between about 200 to 300 Angstrom, does not completely prevent the reflectivity from silicon nitride layer 6, thus resulting in photoresist shape 8b, with undercut, or necked, feature 9, after development of the exposed photoresist regions. This is schematically shown in FIG. 2. An anisotropic reactive ion etching, (RIE), procedure, is next performed, using photoresist shape 8b, with undercut region 9, as a mask, using $CHF_3$ as an etchant for SiON layer 7, for silicon nitride capping layer 6, and for silicon oxide layer 5, while $Cl_2$ is used as an etchant for metal silicide layer 4, and for polysilicon layer 3. Undercut region 9, of photoresist shape 8b, however is transferred to the silicon nitride capped, gate structure, with unwanted undercut region 10, located in the polycide component of the silicon nitride capped, gate structure. This is schematically shown in FIG. 3. This profile for the silicon nitride capped, gate structure, with unwanted undercut, or necked region 10, in the polycide portion of the gate structure, will result in a shorter than designed, channel region, when a self-aligned source/drain region is formed in regions of semiconductor substrate, not covered by the gate structure.

Figure 4:
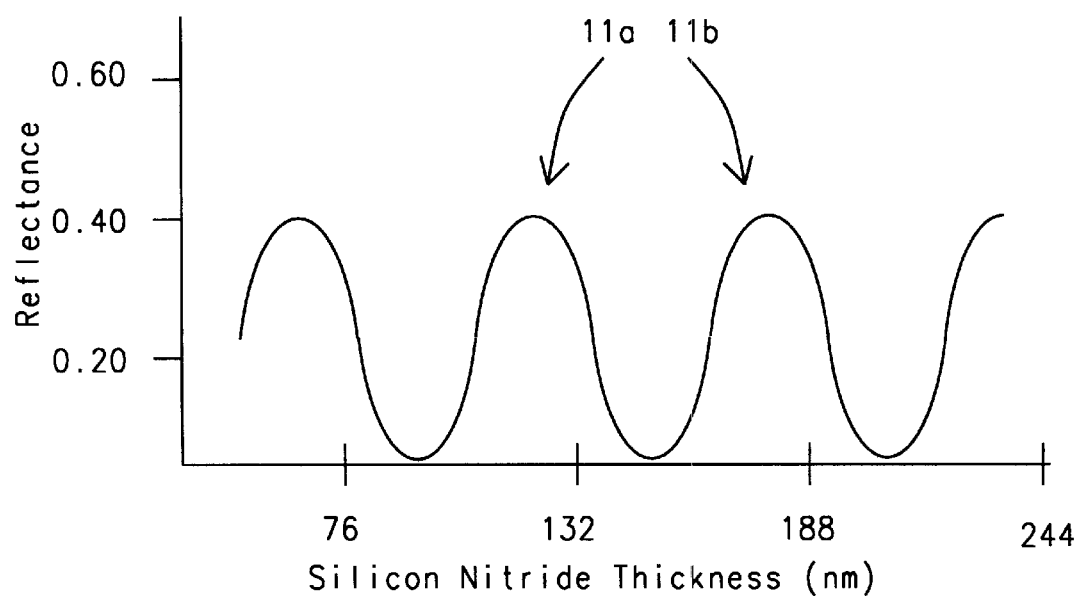
FIG. 4, which shows the relationship between reflectivity, occurring during a photolithographic exposure procedure, and the thickness of a silicon nitride capping layer, underlying a thin SiON BARC layer.
Figure 5:
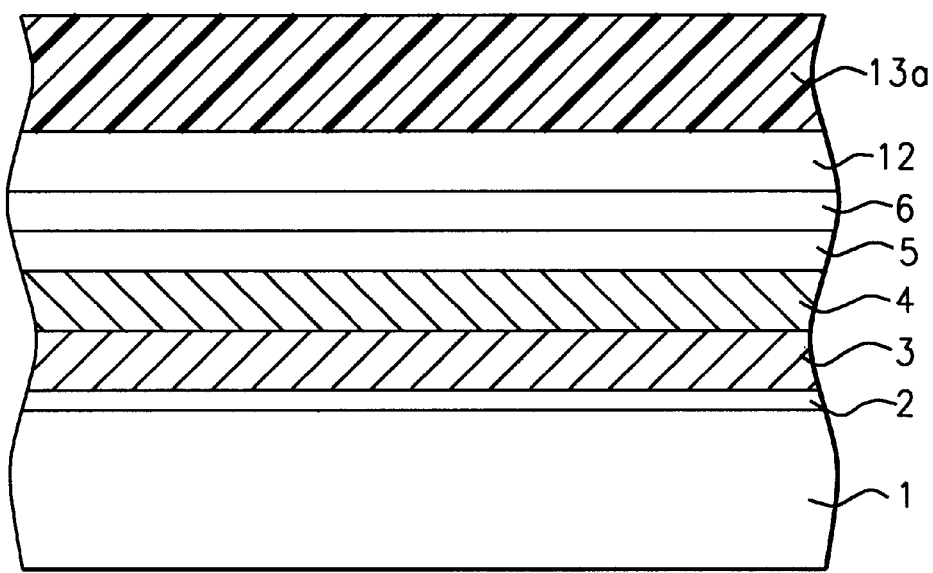
FIGS. 5–6, 8–11, which schematically, in cross-sectional style, show the key stages of fabrication, used to create a narrow width, straight walled, silicon nitride capped, gate structure, using a SiON BARC layer, between about 820 to 920 Angstroms, in thickness, as an anti-reflective coating, underlying a photoresist layer, during the creation of the narrow width, straight walled, gate defining, photoresist shape.
Figure 6:
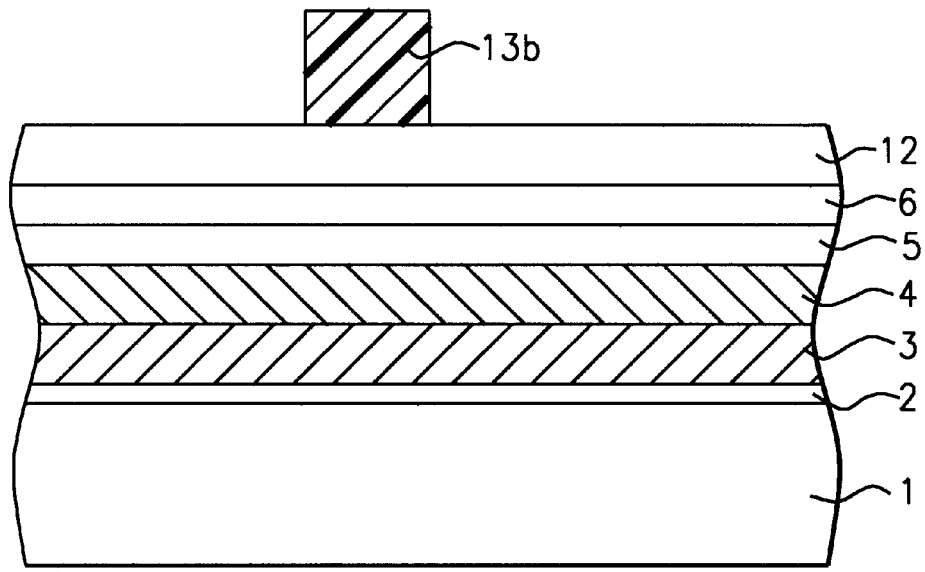

The ability of SiON layer 7, at a thickness between about 200 to 300 Angstroms, to prevent the reflectivity from silicon nitride layer 6, during the photolithographic exposure, used to create the gate defining, photoresist shape, is a function of the thickness of silicon nitride layer 6, FIG. 4, shows the relationship of reflectivity, as a function of silicon nitride thickness, using an overlying SiON BARC layer, with a thickness between about 200 to 300 Angstroms. It can be seen that small changes in silicon nitride thickness result in large changes in reflectivity. Therefore the control of the gate defining, photoresist shape, and the subsequent control of the dimension of MOSFET channel region, can be difficult to achieve as a result of small changes in silicon nitride thickness. It can be seen in FIG. 4, that minimum reflectance occurs at a silicon nitride thickness of about 1500 Angstroms, however a small change in the thickness of silicon nitride capping layer, to about 1250, or to about 1700 Angstroms, which can occur using conventional LPCVD or PECVD procedures, results in a large increase in reflectivity, shown as points 11a, and 11b, in FIG. 4, thus subsequently resulting in a undesirable gate defining photoresist shape.

Figure 7:
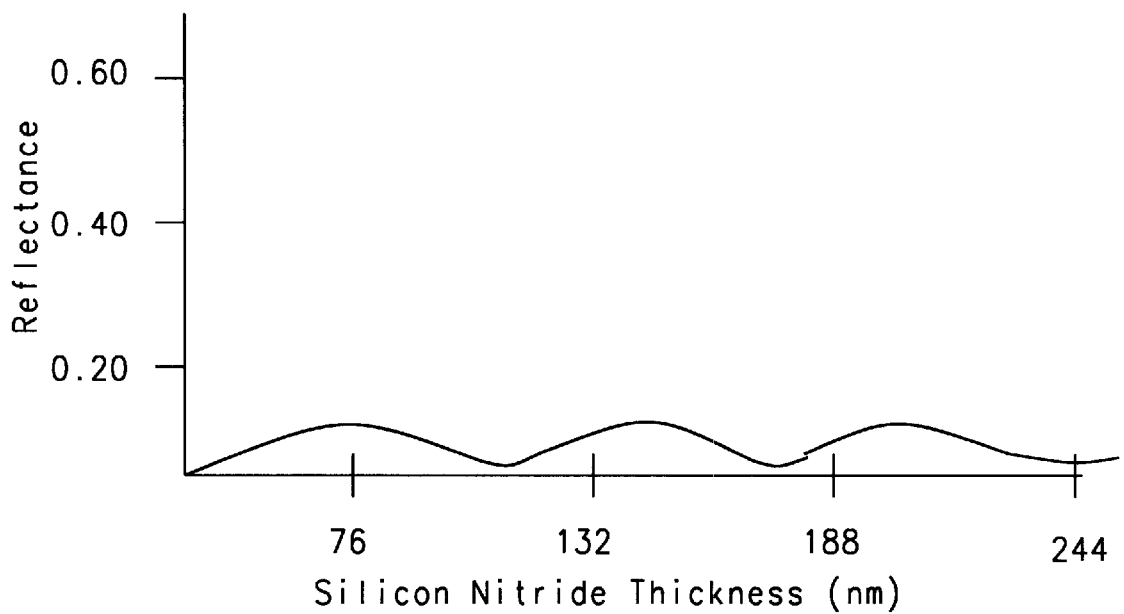
FIG. 7 which shows the relationship between reflectivity, occurring during a photolithographic exposure procedure, and the thickness of a silicon nitride capping layer, which is located underlying a SiON BARC layer, between about 820 to 920 Angstroms in thickness.

The method of creating, uniform gate defining, photoresist shapes, and thus uniform MOSFET channel region dimensions, independent of silicon nitride capping layer thickness, is now described, and shown schematically in FIGS. 5–11. FIG. 5, schematically again shows the stack of layers, needed to create the desired silicon nitride capped, gate structure, again comprised of: silicon dioxide gate insulator layer 2; polysilicon layer 3; tungsten silicide layer 4; silicon oxide layer 5; and silicon nitride capping layer 6; all at the identical thicknesses previously used and described in FIG. 1. However in this case BARC layer 12, again comprised of SiON, is formed at a thickness between about 820 to 920 Angstroms. A photoresist layer 13a, is next applied, and exposed at conditions identical to hi conditions previously described for exposure of photoresist layer 8a. Development of the exposed regions of photoresist layer 13a, however now result in photoresist shape 13b, exhibiting a straight walled profile, without necked regions, as was the case for the previously shown photoresist shape 8b. Straight walled, photoresist shape 13b, shown schematically in FIG. 6, was obtainable due to the restriction of reflectance, during the photolithographic exposure of photoresist layer 13a. . The restricted reflectance was in turn a result the use of SiON BARC layer 12, at a thickness between about 820 to 920 Angstroms. FIG. 7, shows the relationship of reflectance as a function of silicon nitride thickness, and it can be seen that with the use of the thicker SiON BARC layer 12, reflectance is not influenced by the thickness of silicon nitride, therefore thickness variations, that can occur during the LPCVD or PECVD procedures, will not negate the attainment of the desired straight walled, photoresist shape.

Figure 8:
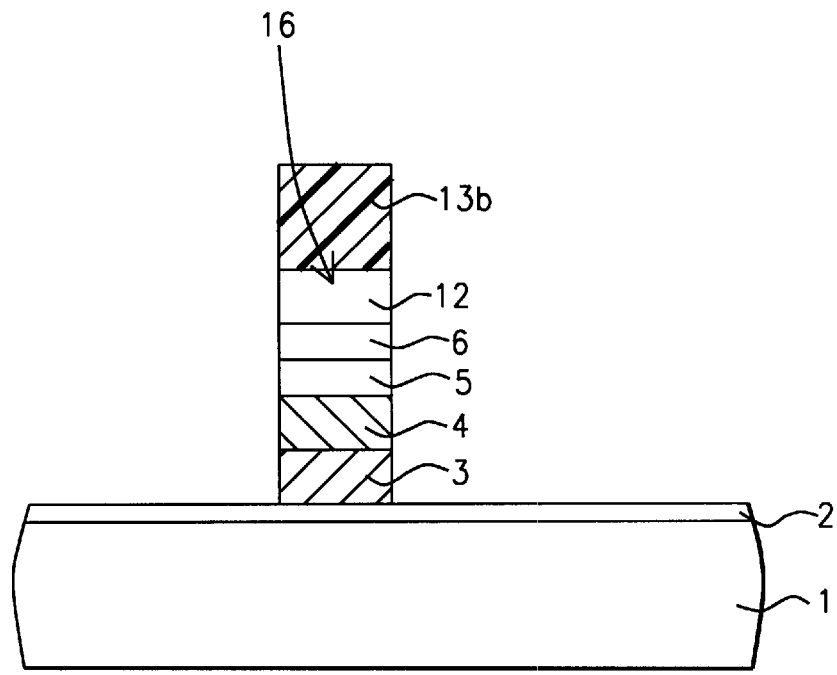
Figure 9:
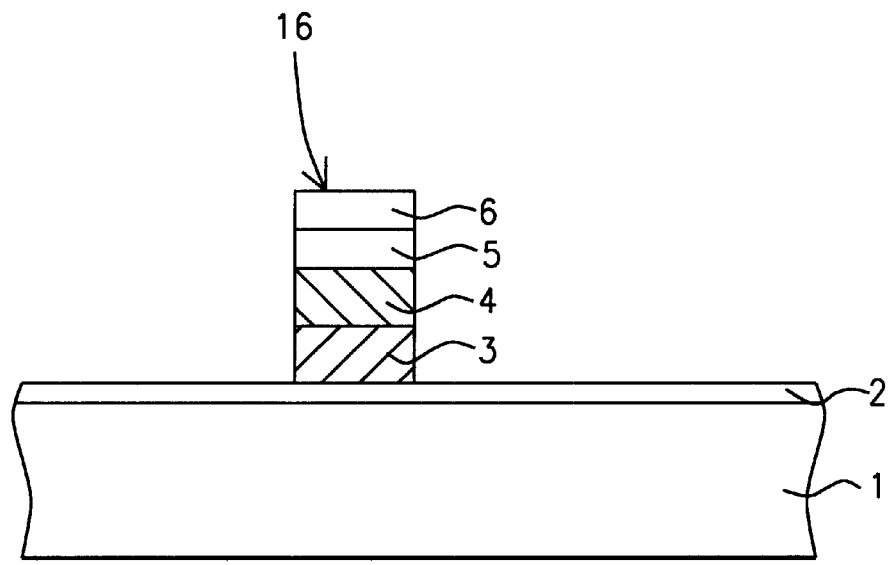
Figure 10:
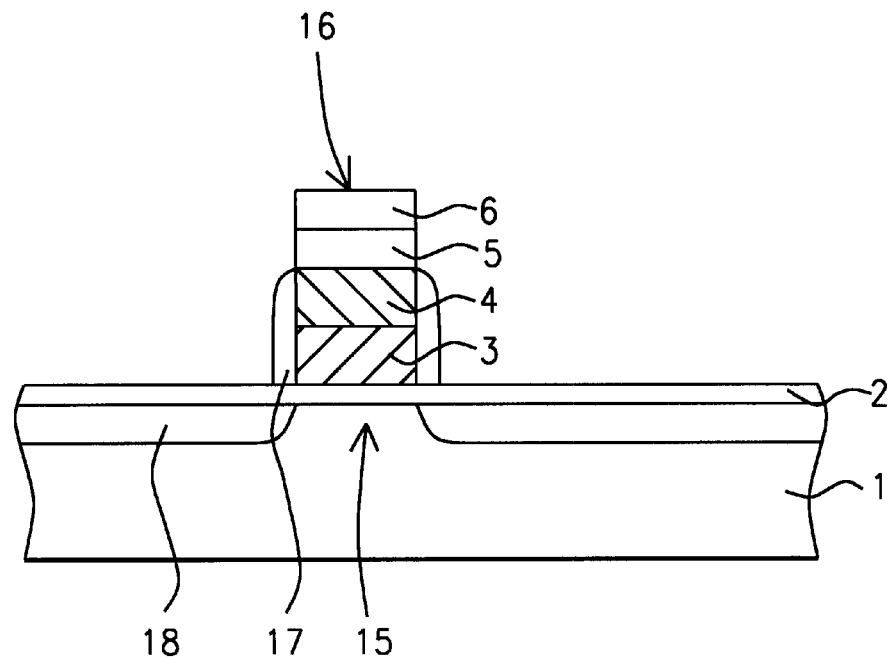

An anisotropic RIE procedure, performed using straight walled photoresist shape 13b, as a mask, and again using $CHF_3$ as an etchant for SiON BARC layer 12, for silicon nitride capping layer 6, and for silicon oxide layer 5, while using $Cl_2$ as an etchant for metal silicide layer 4, and for polysilicon layer 3, result in the formation of straight walled, silicon nitride capped, gate structure 16, shown schematically in FIG. 8. Straight walled photoresist shape 13b, is removed via a plasma oxygen ashing procedure, while removal of SiON, BARC layer 12, is accomplished via a RIE procedure, however another option is not to remove SiON BARC layer 12. The result of these procedures is shown schematically in FIG. 9. After thermally growing a protective silicon oxide layer 17, on the sides of the polycide component of straight walled, silicon nitride capped, gate structure 16, at a thickness between about 30 to 120 Angstroms, lightly doped source/drain region 18, shown schematically in FIG. 10, is formed in a region of semiconductor substrate 1, not covered by straight walled, silicon nitride capped, gate structure 16. Lightly doped source/drain region 18, formed via ion implantation of arsenic or phosphorous ions, at an energy between about 10 to 50 KeV, and at a dose between about 1E12 to 1E14 atoms/cm$^2$, results in the creation of narrow channel region 15, located under straight walled, silicon nitride capped, gate structure 16, and located between lightly doped source/drain region 18. If the a non-straight walled, gate structure, had been used as a mask during the self-aligned formation of lightly doped source/drain region 18, channel region 15, would have a different dimension than shown in FIG. 10, possibly adversely influencing the performance of the MOSFET device.

Figure 11:
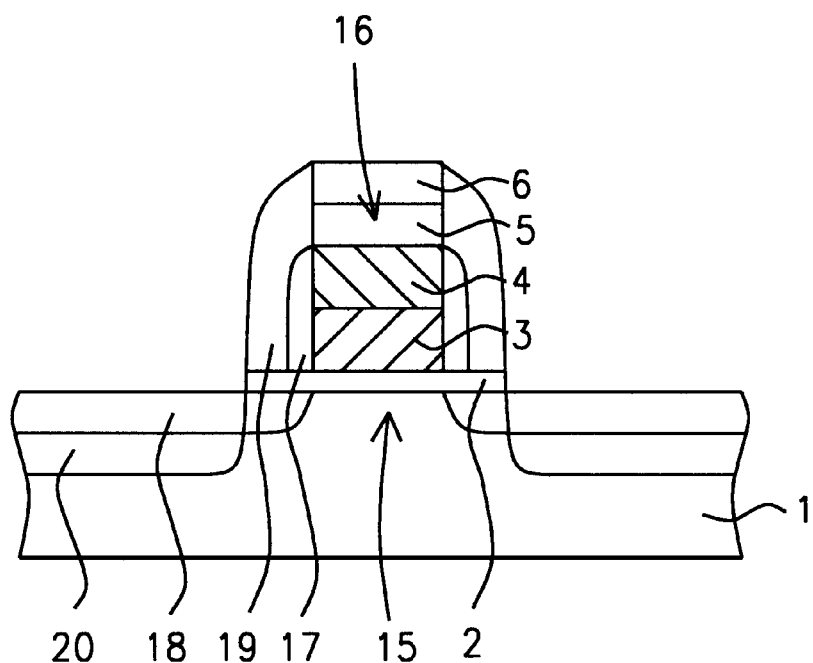

The completion of the MOSFET device is next described, and schematically shown in FIG. 11. An insulator layer, such as silicon nitride, or silicon oxide, is deposited using LPCVD or PECVD procedures, at a thickness between about 300 to 1000 Angstroms. An anisotropic RIE procedure, using $CHF_3$, or $CF_4$ as an etchant, is used to create insulator spacers 19, on the sides of straight walled, silicon nitride capped, gate structure 16. The anisotropic RIE procedure also removes the portion of gate insulator layer 2, not covered by straight walled, silicon nitride capped, gate structure 16, or by insulator spacers 19. Heavily doped source/drain region 20, is next formed in regions of semiconductor substrate 1, not covered by straight walled, silicon nitride capped, gate structure 16, or by insulator spacers 19. Heavily doped source/drain region 20, is formed via ion implantation of arsenic, or phosphorous ions, at an energy between about 30 to 60 KeV, at a dose between about 1E14 to 1E16 atoms/cm$^2$.

While this invention has been particularly shown and described with reference to, the preferred embodiments thereof, it will be understood by those skilled in the art that various changes in form and details may be made without departing from the spirit or scope of this invention.

What is claimed is:

1. A method of fabricating a gate structure, on a semiconductor substrate, comprising the steps of:

growing a gate insulator layer on said semiconductor substrate;

depositing a series of layers, comprised of an underlying conductive layer, a silicon oxide layer, and an overlying silicon nitride layer;

forming a bottom anti-reflective coating, (BARC), layer, between about 820 to 920 Angstroms in thickness, on said silicon nitride layer;

forming a photoresist shape, on said BARC layer;

performing an anisotropic, dry etching procedure, to form a silicon nitride capped, gate structure, on said gate insulator layer, with said silicon nitride capped, gate structure comprised of said BARC layer, of said silicon nitride layer, of said silicon oxide layer, and of said conductive layer;

removing said BARC layer from said silicon nitride capped, gate structure; forming a lightly doped source/drain region in an area of said semiconductor substrate not covered by said silicon nitride capped, gate structure, with a channel region underlying said silicon nitride capped, gate structure, located between said lightly doped source/drain region;

forming insulator spacers on the sides of said silicon nitride capped, gate structure; and forming a heavily doped source/drain region in an area of said semiconductor substrate not covered by said silicon nitride capped, gate structure, and not covered by said insulator spacers.

2. The method of claim 1, wherein said gate insulator layer is comprised of silicon dioxide, obtained via thermal oxidation procedures, at a thickness between about 30 to 150 Angstroms.

3. The method of claim 1, wherein said conductive layer is a polycide layer, comprised of an underlying polysilicon layer, obtained via LPCVD procedures, at a thickness between about 900 to 1100 Angstroms, doped in situ, during deposition, via the addition of arsine, or phosphine to a silane ambient, and comprised of an overlying metal silicide layer obtained via LPCVD procedures, at a thickness between about 900 to 1100 Angstroms.

4. The method of claim 1, wherein said silicon oxide layer is obtained via LPCVD or PECVD procedures, at a thickness between about 200 to 400 Angstroms, using TEOS as a source.

5. The method of claim 1, wherein said silicon nitride layer is obtained via LPCVD or PECVD procedures, at a thickness between about 1500 to 2500 Angstroms.

6. The method of claim 1, wherein said BARC layer is a silicon oxynitride layer, obtained via PECVD procedures, to a thickness between about 820 to 920 Angstroms.

7. The method of claim 1, wherein said photoresist shape, is a straight walled, photoresist shape.

8. The method of claim 1, wherein said silicon nitride capped, gate structure, comprised of said silicon nitride layer, said silicon oxide layer, and said conductive layer, is formed via an anisotropic reactive ion etching procedure, using $CHF_3$ as an etchant for said BARC layer, for said silicon nitride layer, and for said silicon oxide layer, and using $Cl_2$ as an etchant for said conductive layer.

9. The method of claim 1, wherein said lightly doped source/drain region is formed via an ion implantation procedure, using arsenic, or phosphorous ions, at an energy between about 10 to 50 KeV, at a dose between about 1E12 to 1E14 atoms/$cm^2$.

10. The method of claim 1, wherein said insulator spacers are comprised of silicon nitride, or silicon oxide, obtained via the deposition of a silicon nitride, or a silicon oxide layer, via LPCVD or PECVD procedures, at a thickness between about 300 to 1000 Angstroms, and defined via an anisotropic RIE procedure, using $CF_4$ as an etchant for silicon nitride, or using $CHF_3$ as an etchant for silicon oxide.

11. The method of claim 1, wherein said heavily doped source/drain region is formed via an ion implantation procedure, using arsenic, or phosphorous ions, at an energy between about 30 to 60 KeV, and at a dose between about 1E14 to 1E16 atoms/$cm^2$.

12. A method of fabricating a straight walled, silicon nitride capped, gate structure, for a MOSFET device, on a semiconductor substrate, comprising the steps of:

growing a silicon dioxide gate insulator layer, on said semiconductor substrate;

depositing a polysilicon layer;

depositing a tungsten silicide layer;

depositing a silicon oxide layer;

depositing a silicon nitride capping layer;

forming a SiON BARC layer, at a thickness between about 820 to 920 Angstroms, on said silicon nitride capping layer;

forming a straight walled, photoresist shape, on said SiON BARC layer;

performing a first anisotropic RIE procedure, using the straight walled, photoresist shape as a mask, to create said straight walled, silicon nitride capped, gate structure, on said silicon dioxide gate insulator layer, with said straight walled, silicon nitride capped, gate structure, comprised of said SiON BARC layer, said silicon nitride capping layer, said silicon oxide layer, said tungsten silicide layer, and said polysilicon layer;

removing said straight walled, photoresist shape, and removing said SiON BARC layer;

forming a lightly doped source/drain region, in a region of said semiconductor substrate not covered by said straight walled, silicon nitride capped, gate structure, with said lightly doped source/drain region self aligned to said straight walled, silicon nitride capped, gate structure, creating a channel region, in the region of said semiconductor substrate, underlying said straight walled, silicon nitride capped, gate structure;

depositing an insulator layer;

performing a second anisotropic RIE procedure, to create insulator spacers, on the sides of said straight walled, silicon nitride capped, gate structure; and forming a heavily doped source/drain region in a region of said semiconductor substrate not covered by said straight walled, silicon nitride capped, gate structure, or by said insulator spacers.

13. The method of claim 12, wherein said silicon dioxide gate insulator layer is obtained via thermal oxidation procedures, at a thickness between about 30 to 150 Angstroms.

14. The method of claim 12, wherein said polysilicon layer is obtained via LPCVD procedures, at a thickness between about 900 to 1100 Angstroms, and doped in situ, via the addition of arsine, or phosphine, to a silane ambient, or deposited intrinsically, then doped via an ion implantation procedure, using arsenic, or phosphorous ions.

15. The method of claim 12, wherein said tungsten silicide layer is obtained via LPCVD procedures, at a thickness between about 900 to 1100 Angstroms, using tungsten hexafluoride and silane as reactants.

16. The method of claim 12, wherein said silicon oxide layer is obtained via LPCVD or PECVD procedures, at a thickness between about 200 to 400 Angstroms, using TEOS as a source.

17. The method of claim 12, wherein said silicon nitride capping layer is obtained via LPCVD or PECVD procedures, at a thickness between about 1500 to 2500 Angstroms.

18. The method of claim 12, wherein said SiON BARC layer, at a thickness between about 820 to 920 Angstroms, is obtained via PECVD procedures.

19. The method of claim 12, wherein said straight walled, silicon nitride capped, gate structure, is formed using said straight walled, photoresist shape as an etch mask, during said first anisotropic RIE procedure, which features the use of $CHF_3$ as an etchant for said SiON BARC layer, for said silicon nitride capping layer, and for said silicon oxide layer, while featuring the use of $Cl_2$ as an etchant for said tungsten silicide layer, and for said polysilicon layer.

20. The method of claim 12, wherein said lightly doped source/drain region is formed via an ion implantation procedure, using arsenic, or phosphorous ions, at an energy between about 10 to 50 KeV, at a dose between about 1E12 to 1E14 atoms/$cm^2$.

21. The method of claim 12, wherein said insulator layer, is a silicon nitride layer, or a silicon oxide layer, obtained via LPCVD or PECVD procedures, at a thickness between about 300 to 1000 Angstroms.

22. The method of claim 12, wherein said second anisotropic RIE procedure, used to create said insulator spacers, is performed using $CF_4$ as an etchant for silicon nitride, or performed using $CHF_3$ as an etchant for silicon nitride.

23. The method of claim 12, wherein said heavily doped source/drain region is formed via an ion implantation procedure, using arsenic or phosphorous ions, at an energy between about 30 to 60 KeV, at a dose between about 1E14 to 1E16 atoms/$cm^2$.

* * * * *